US007026249B2

(12) United States Patent
Bedell et al.

(10) Patent No.: US 7,026,249 B2
(45) Date of Patent: Apr. 11, 2006

(54) SIGE LATTICE ENGINEERING USING A COMBINATION OF OXIDATION, THINNING AND EPITAXIAL REGROWTH

(75) Inventors: Stephen W. Bedell, Wappingers Falls, NY (US); Huajie Chen, Wappingers Falls, NY (US); Keith E. Fogel, Mohegan Lake, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 10/448,954

(22) Filed: May 30, 2003

(65) Prior Publication Data

US 2004/0242006 A1    Dec. 2, 2004

(51) Int. Cl.
*H01L 21/302* (2006.01)
(52) U.S. Cl. .................. 438/706; 438/692; 428/641
(58) Field of Classification Search ........ 438/689–692, 438/706, 710, 712, 714, 719–722; 428/641, 428/642
See application file for complete search history.

(56) References Cited

U.S. PATENT DOCUMENTS

| 5,461,243 | A | 10/1995 | Ek et al. | |
|---|---|---|---|---|
| 5,759,898 | A | 6/1998 | Ek et al. | |
| 6,441,393 | B1 * | 8/2002 | Goetz et al. | 257/13 |
| 6,593,625 | B1 * | 7/2003 | Christiansen et al. | 257/347 |
| 6,602,613 | B1 * | 8/2003 | Fitzgerald | 428/641 |
| 6,607,948 | B1 * | 8/2003 | Sugiyama et al. | 438/151 |
| 6,709,909 | B1 * | 3/2004 | Mizuno et al. | 438/167 |
| 6,841,457 | B1 * | 1/2005 | Bedell et al. | 438/479 |
| 2004/0142541 | A1 * | 7/2004 | Cohen et al. | 438/479 |
| 2004/0241460 | A1 * | 12/2004 | Bedell et al. | 428/446 |

FOREIGN PATENT DOCUMENTS

WO    WO 02/27783 A1    4/2002
WO    WO 02/082514 A1    10/2002

OTHER PUBLICATIONS

Tezuka, et al., "Fabrication of strained Si on an ultrathin SiGe-on-insulator virtual substrate with a high-Ge fraction", Applied Physics Letters, vol. 79, No. 12, pp. 1798-1800, Sep. 17, 2001.

* cited by examiner

*Primary Examiner*—Kin-Chan Chen
(74) *Attorney, Agent, or Firm*—Scully, Scott, Murphy & Presser, P.C.; Robert M. Trepp, Esq.

(57) ABSTRACT

The present invention provides a method of fabricating a SiGe-on-insulator substrate in which lattice engineering is employed to decouple the interdependence between SiGe thickness, Ge fraction and strain relaxation. The method includes providing a SiGe-on-insulator substrate material comprising a SiGe alloy layer having a selected in-plane lattice parameter, a selected thickness parameter and a selected Ge content parameter, wherein the selected in-plane lattice parameter has a constant value and one or both of the other parameters, i.e., thickness or Ge content, have adjustable values; and adjusting one or both of the other parameters to final selected values, while maintaining the selected in-plane lattice parameter. The adjusting is achieved utilizing either a thinning process or a thermal dilution process depending on which parameters are fixed and which are adjustable.

15 Claims, 5 Drawing Sheets

SIGE LATTICE ENGINEERING USING A COMBINATION OF OXIDATION, THINNING AND EPITAXIAL REGROWTH

FIELD OF THE INVENTION

The present invention provides a method for fabricating a semiconductor substrate material, and more particularly to a method of fabricating SiGe-on-insulator substrate materials in which lattice engineering is employed to decouple the interdependence between SiGe thickness, Ge content and strain relaxation. By breaking the natural relationship between the aforementioned parameters, a SiGe-on-insulator substrate material can be fabricated that has selected values of Ge content, thickness and in-plane lattice parameter. The SiGe-on-insulator substrate material of the present invention may be used as a lattice mismatched template for creating a strained Si layer thereon. Such strained Si layers have high carrier mobility and are useful in high-performance performance complementary metal oxide semiconductor (CMOS) applications.

BACKGROUND OF THE INVENTION

In the semiconductor industry, there has recently been a high-level of activity using strained Si-based heterostructures to achieve high mobility structures for CMOS applications. Traditionally, the prior art method to implement this has been to grow strained Si layers on thick (on the order of from about 1 to about 5 micrometers) relaxed SiGe buffer layers.

Despite the high channel electron mobilities reported for prior art heterostructures, the use of thick SiGe buffer layers has several noticeable disadvantages associated therewith. First, thick SiGe buffer layers are not typically easy to integrate with existing Si-based CMOS technology. Second, the defect densities, including threading dislocations (TDs) and misfit dislocations, are from about 105 to about 108 defects/cm$^2$ which are still too high for realistic VSLI (very large scale integration) bulk substrate (non-SOI) applications. Thirdly, the nature of the prior art structure precludes selective growth of the SiGe buffer layer so that circuits employing devices with strained Si, unstrained Si and SiGe materials are difficult, and in some instances, nearly impossible to integrate.

In order to produce relaxed SiGe material on a Si substrate, prior art methods typically grow a uniform, graded or stepped, SiGe layer to beyond the metastable critical thickness (i.e., the thickness beyond which dislocations form to relieve stress) and allow misfit dislocations to form, with the associated threading dislocations, through the SiGe buffer layer. Various buffer structures have been used to try to increase the length of the misfit dislocation section in the structures and thereby to decrease the TD density.

Another prior art approach, such as described in U.S. Pat. Nos. 5,461,243 and 5,759,898, both to Ek, et al., provides a structure with a relaxed and reduced defect density semiconductor layer wherein a new strain relief mechanism operates whereby the SiGe buffer layer relaxes while reducing the generation of TDs within the SiGe layer.

A further approach to provide low-defect, substantially relaxed SiGe-on-insulator substrate material is disclosed, for example, in co-pending and co-assigned U.S. patent application Ser. No. 10/055,138, filed Jan. 23, 2002, entitled "Method of Creating High-Quality Relaxed SiGe-On-Insulator for Strained Si CMOS Applications". In this prior art approach, the relaxed SiGe layer is created using a thermal mixing process.

Despite the numerous advances made in the prior art for fabricating SiGe-on-insulator substrate materials, none of the prior art is capable of providing a method in which the interdependence between the SiGe thickness, the Ge content and the strain relaxation, i.e., in plane lattice parameter, can be decoupled so as to provide a SiGe-on-insulator substrate material containing a relaxed SiGe layer having selected values of thickness, Ge content and strain relaxation. The strain relaxation is related to the in-plane lattice parameter (lattice parameter parallel to the SiGe layer surface) of the relaxed SiGe layer formed in the present invention.

SUMMARY OF THE INVENTION

The present invention provides a method of fabricating a SiGe-on-insulator substrate material in which the interdependence between SiGe thickness, Ge fraction (i.e., content) and strain relaxation (i.e., in-plane lattice parameter) is decoupled so that one can fabricate a SiGe-on-insulator substrate material with arbitrary values of Ge content, thickness and strain relaxation (within the limits of thermodynamic and mechanical stability). In fact, the residual strain in the SiGe layer can be made to be positive (compressive), negative (tensile) or zero (fully relaxed). There are many advantages to such a method. For instance, a fully relaxed, thin SiGe layer of arbitrary Ge content can be fabricated and used for ultra-thin strained silicon-on-insulator high-performance CMOS integrated circuits (ICs). If high Ge content films pose IC manufacturing integration issues, than a tensile, lower Ge content film with the same in-plane lattice parameter may be used instead.

In yet another example, if Si/SiGe bilayers are patterned into geometrically microscopic islands as in the case of modern SOI device isolation techniques, it is possible to have a top Si layer under tensile strain attempt to relax by elastic partitioning if the SiGe layer is relaxed. One can then calculate what value of compressive strain must exist within the SiGe template for mechanical equilibrium to be maintained between the (tensile) strained Si layer and the (compressive) strained SiGe layers.

In broad terms, the present invention provides a method of forming a SiGe-on-insulator (SGOI) substrate having predetermined parameters comprising the steps of:

providing an initial SiGe-on-insulator substrate material comprising a SiGe alloy layer having a selected in-plane lattice parameter, a selected thickness parameter and a selected Ge content parameter, wherein the selected in-plane lattice parameter has a constant value and one or both of the other parameters, i.e., SiGe alloy layer thickness or Ge content, have an adjustable value; and adjusting one or both of the other parameters to a final selected value, while maintaining the in-plane lattice parameter.

In one embodiment of the present invention, the selected in-plane lattice parameter and the selected Ge content parameter of the SiGe alloy layer are constant, i.e., fixed at preselected values, while the SiGe thickness is adjustable. In this embodiment of the present invention, the SiGe thickness of the SiGe alloy layer is adjusted using a non-selective etching process that is capable of thinning the SiGe thickness to a desired final thickness value.

In another embodiment of the present invention, the selected in-plane lattice parameter of the SiGe alloy layer is constant, while both the thickness and Ge content are adjustable. In this embodiment of the present invention, the Ge content is adjusted by forming a Si-containing layer on a surface of the SiGe alloy layer and then using a thermal dilution process which is capable of causing Si diffusion into the SiGe alloy layer thereby decreasing the Ge content of the SiGe alloy layer while increasing the thickness parameter. The dilution occurs by a diffusion anneal which is capable of homogenizing the Si layer throughout the SiGe alloy layer.

It is important in the second embodiment that the Si-containing layer grown on the SiGe alloy layer is below the critical thickness for a given in-plane lattice parameter to ensure that the in-plane lattice parameter is conserved during the dilution annealing.

DETAILED DESCRIPTION OF THE INVENTION

Figure 1A:
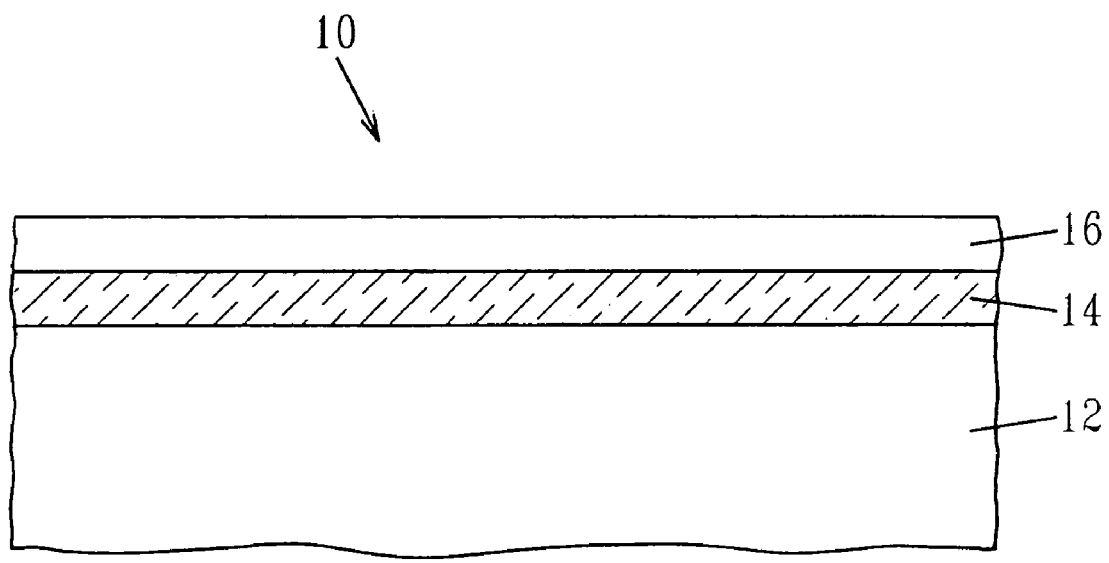
FIGS. 1A–1B are pictorial representations (through cross-sectional views) illustrating one embodiment of the present invention in which a non-selective etching process is used to thin the SiGe thickness to a desired thickness value.

The present invention, which provides a method of fabricating SiGe-on-insulator substrate materials in which the interdependence between SiGe thickness, Ge content and in-plane lattice parameter have been decoupled so as to provide tailored SiGe-on-insulator substrates having a selected and desired SiGe thickness, Ge content and in-plane lattice parameter, will now be described in greater detail by referring to the drawings that accompany the present application. In the accompanying drawings, like and corresponding elements are referred to by like reference numerals.

As stated above, the present application provides a method of forming a SiGe-on-insulator substrate having predetermined parameters which includes providing an initial SiGe-on-insulator substrate material comprising a SiGe alloy layer having a selected in-plane lattice parameter, a selected thickness parameter and a selected Ge content parameter, wherein the selected in-plane lattice parameter has a constant value and one or both of the other parameters have an adjustable value; and adjusting one or both of the other parameters to a final selected value, while maintaining the selected in-plane lattice parameter.

The present invention provides two different methods for achieving the above. In a first embodiment of the present invention, an initial SiGe-on-insulator substrate material is first provided having a selected Ge content parameter and a selected in-plane lattice parameter that are constant values to be present in the final SiGe-on-insulator substrate. The thickness of the SiGe alloy layer of the initial SiGe-on-insulator substrate is adjustable, meaning that it has a value that is different from that of a desired thickness value. The thickness of the SiGe layer is then adjusted by utilizing a non-selective etching process. The thinning process will be described under the subheading:

I. SGOI Thinning

In a second embodiment of the present invention, an initial SiGe-on-insulator substrate material is first provided having a selected in-plane lattice parameter that has a constant value to be present in the final SiGe-on-insulator substrate. The Ge content parameter and the thickness parameter of the SiGe alloy layer of the initial SiGe-on-insulator substrate are adjustable, meaning that they have values that are different from those of a desired Ge content and desired thickness. A thermal dilution process is then employed in the present invention to adjust the Ge content to a final desired value. The thermal dilution process will be described under the subheading:

II. Thermal Dilution

I. SGOI Thinning

This embodiment of the present invention begins with providing an initial SiGe-on-insulator substrate material having a selected Ge content parameter and a selected in-plane lattice parameter that are constant values to be present in the final SiGe-on-insulator substrate and a thickness parameter which is adjustable. The initial structure employed in the SGOI thinning embodiment of the present invention is shown, for example, in FIG. 1A. Specifically, the initial SiGe-on-insulator substrate 10 of FIG. 1A comprises a Si-containing layer 12, a barrier layer 14 that is resistant to Ge diffusion located atop the Si-containing layer 12, and a SiGe alloy layer 16 that is located atop the barrier layer 14.

The Si-containing layer 12 of the initial SGOI substrate 10 comprises any semiconductor material that contains silicon. Illustrative examples of suitable semiconductor materials for the Si-containing layer 12 include, but are not limited to: Si, SiGe, SiC, SiGeC, Si/Si, Si/SiC, Si/SiGeC, and preformed silicon-on-insulators. The thickness of Si-containing layer 12 is inconsequential to the present invention.

The barrier layer 14 of the initial SGOI substrate 10 comprises any insulating material that is highly resistant to Ge diffusion. Examples of such insulating and Ge diffusion resistant materials include, but are not limited to: crystalline or non-crystalline oxides or nitrides. The thickness of barrier layer 14 may vary, but typically barrier layer 14 has a thickness of from about 10 to about 1000 nm, with a thickness of from about 50 to about 200 nm being more highly preferred.

The SiGe alloy layer 16 of the initial SGOI substrate 10 is an alloy of silicon and germanium which comprises up to 99.99 atomic percent Ge, preferably the Ge content in the SiGe alloy layer may be from about 0.1 to about 99.9 atomic percent, with a Ge atomic percent of from about 10 to about 35 being even more highly preferred. Another characteristic feature of the SiGe alloy layer 16 is that it is a single crystal material having a measured lattice relaxation of from about 1 to about 100%, with a measured lattice relaxation of from about 50 to about 90% being more highly preferred.

The SiGe alloy layer 16 of the initial SGOI substrate 10 has a thickness of about 2000 nm or less, with a thickness of from about 10 to about 200 nm being more highly preferred. The SiGe alloy layer 16 typically has a defect density including misfits and TDs, of less than about 108 defects/cm$^2$.

In this embodiment of the present invention, the SiGe alloy layer 16 of the initial SiGe-on-insulator substrate 10 has a constant and selected in-plane lattice parameter and a constant and selected Ge content parameter and an adjustable thickness parameter. The initial SiGe-on-insulator substrate material 10 can be made using various techniques that are well known to those skilled in the art in which the SiGe alloy layer 16 is relaxed by a defect-mediated strain relief mechanism.

For example, the thermal mixing process disclosed in co-pending and co-assigned U.S. patent application Ser. No. 10/055,138, filed Jan. 23, 2002, entitled "Method of Creating High-Quality Relaxed SiGe-On-Insulator for Strained Si CMOS Applications", as well as any other method capable of forming thermodynamically stable SiGe-on-insulator substrates, could be used. The thermal mixing process disclosed in the '138 application is a highly preferred method used in the present invention for forming the initial SiGe-on-insulator substrate 10. As such, applicants incorporate the disclosure of the '138 application herein by reference. The above mentioned process forms a SiGe-on-insulator substrate using a defect-mediated strain relief mechanism.

The thermal mixing process disclosed in the '138 application, which is preferred herein, forms the SiGe-on-insulator substrate by first forming a SiGe or pure Ge layer on a surface of a first single crystal Si layer. The first single crystal Si layer is present atop a barrier layer that is resistant to Ge diffusion. A heating step, i.e., high-temperature oxidation, is then performed at a temperature which permits interdiffusion of Ge throughout the first single crystal Si layer and the SiGe or pure Ge layer thereby forming a substantially relaxed, single crystal SiGe layer atop the barrier layer.

The heating step of the '138 application is performed at a temperature of from about 900° to about 1350° C. in the presence of an oxidizing ambient such as O2, NO, N2O, ozone, air and other like oxygen-containing gases. The heating step is performed under an oxidizing ambient to achieve the presence of a surface oxide layer, which acts as a diffusion barrier to Ge atoms. Once the surface oxide layer is formed on the structure, germanium becomes trapped between the barrier layer and the surface oxide layer. As the surface oxide layer increases in thickness, the Ge becomes more uniformly distributed throughout the pure Ge or SiGe layer and the first single crystal Si, but it is continually and efficiently rejected from the encroaching oxide layer. The surface oxide layer is removed, as described, in the '138 application, and that SiGe-on-insulator substrate may be used in the present invention as the initial SiGe-on-insulator substrate used in the present invention.

Formation of an initial SiGe-on-insulator substrate material 10 using the approach described in the '138 application offers a cost-efficient, easily manufacturable process for fabricating high-quality SiGe-on-insulator substrates. Moreover, the combination of Ge homogenization and rejection of the Ge from the growing surface oxide layer using the method disclosed in the '138 application keep the Ge within the SGOI layer trapped between the surface oxide layer and the barrier layer. As the oxidation process continues, the relative Ge fraction of the SGOI film increases in a manner that is inversely proportional to the SGOI thickness. At high temperatures (on the order of about 1150° C. or greater), relaxation of the pure Ge or SiGe layer occurs and strain-relieving defects are being formed and annihilated dynamically. The final strained state of the SGOI film is, in general, not 100% relaxed. Because the defects ultimately relax the SiGe layer, thermodynamic equilibrium will be reached when there is a balance between the elastic energy of the film (residual strain) and the strain-relieving defect density.

Notwithstanding the technique used in forming the initial SiGe-on-insulator substrate material 10 of the present invention, the following rational is employed in determining the constant parameters of the initial SGOI substrate 10: Dislocation defects increase the total energy of a film and are therefore not thermodynamically favored. In the case of a strained film, the introduction (and movement) of a dislocation defect can also reduce the strain energy within the film. The introduction of a dislocation in a strained film becomes energetically favorable when the total energy of the film is lowered. This typically occurs when the reduction in strain energy due to the introduction of a dislocation is greater than the creation energy (or self-energy) of the actual dislocation. The mathematical procedure for calculating the minimum film energy, and thus final relaxation, of relaxed SiGe strained layers exists within the prior art; see "Germanium—Silicon Strained Layers and Heterostructures", S. C. Jain, Advances in electronics and electron physics; supplement 24. 1994 Academic Press (and references therein). From this prior art theory, one can calculate the residual strain of a thermodynamically stable SiGe alloy layer of thickness h using the expression:

$$\varepsilon_{res}\ (\%) = \frac{b\left(1 - \frac{1}{4}\right)}{4\pi(1+v)h} \ln\left(\frac{2h}{b}\right) \times 100$$

where $\varepsilon_{res}$ is the residual strain in the SiGe alloy layer, b is the Burgers vector (3.84 Angstroms), v is the poisson ratio (0.275). This expression assumes that the geometry of the strain-relieving defect is a dislocation whose Burgers vector forms a 60° angle with the dislocation direction (60° dislocation).

Figure 2:
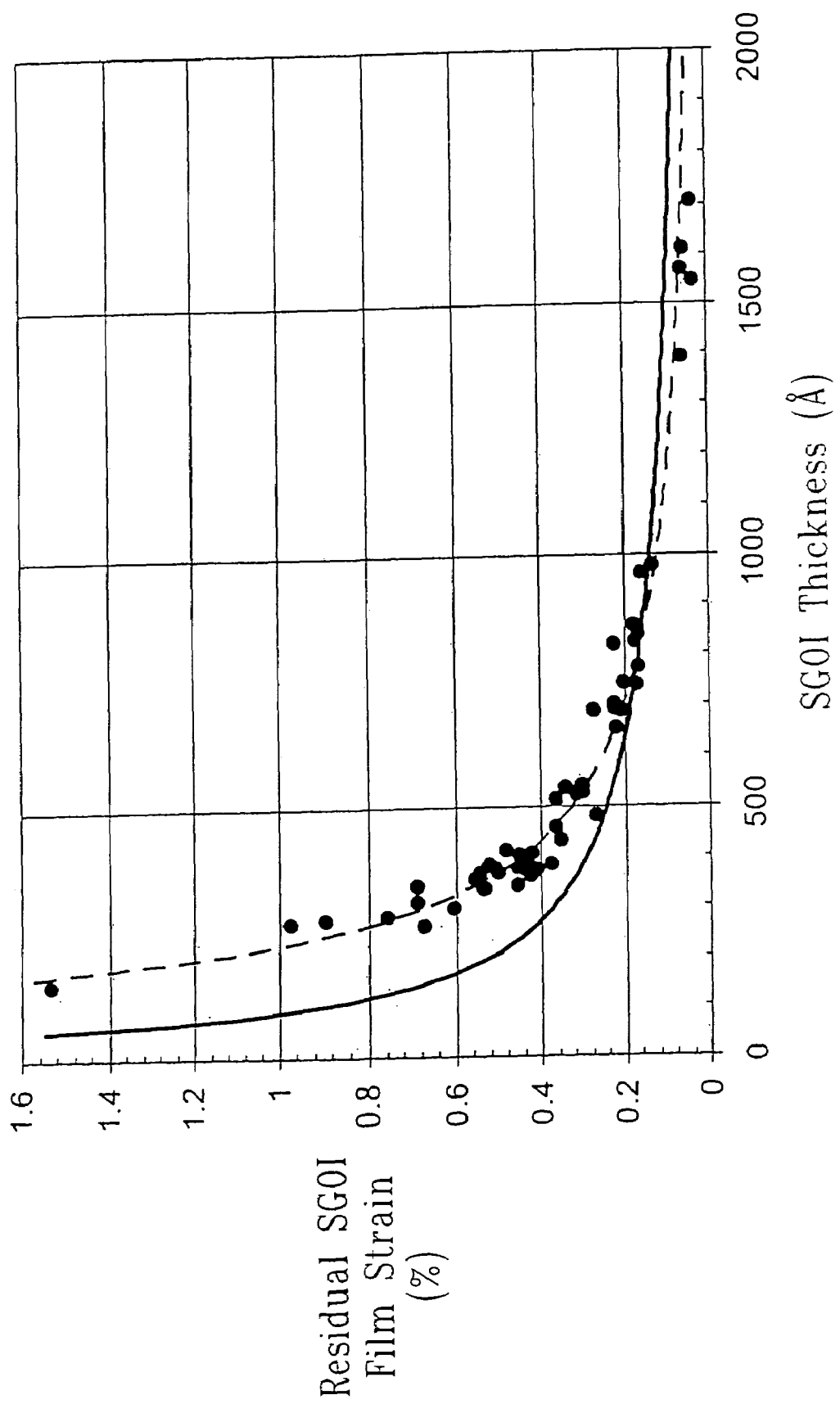
FIG. 2 is a graph of measured residual strain in a SiGe-on-insulator substrate for various SiGe thickness and Ge content.

The solid line shown in FIG. 2 is a plot of the above analytical expression for the residual (compressive) strain in a SiGe layer as a function of the thickness. Also shown are the measured data (solid circles) showing agreement with the above expression for SiGe layers thicker than about 500 Angstroms. If greater accuracy is required, the empirical expression found by fitting a power function to the measured data (dashed line) can be used, and is given by:

$$\varepsilon_{res}\ (\%) = \frac{2290.4}{h^{1.4267}}$$

The in-plane lattice parameter of the relaxed (thermodynamically stable) SiGe-on-insulator layer can be calculated using the following relationship:

$$f_m'(\%) = f_m(\%) - |\varepsilon_{res}|$$

where fm is the misfit strain of the unrelaxed SiGe, $\varepsilon_{res}$ is the residual strain in the SiGe layer given by either of the expressions above and fm' is the in-plane lattice parameter of the relaxed SiGe layer in terms of percent larger than Si. Therefore, if a Si layer is subsequently grown on the relaxed SiGe layer, it will be strained in a tensile manner with a magnitude equal to |fm'|. If $\varepsilon_{res}$ is equal to or larger than fm, fm' will be zero (it cannot be negative) which implies that the unrelaxed SiGe layer is thermodynamically stable and thus will not relax.

The relationship between the misfit strain and the Ge content of a Si1-xGex alloy layer grown on a Si lattice can be given by a simple linear expression:

$$f_m(\%) = 4.17x$$

or more accurately by the expression:

$$f_m (\%) = \left( \frac{(0.19836)x + (0.03265)x^2 - (0.00436)x^3}{5.43105} \right) \times 100$$

where x is the atomic of Ge to Si atoms and is a number between 0 (pure Si) and 1 (pure Ge).

As an example, if a strained Si layer is required that has a tensile strain of 0.60% and the Ge content of the SiGe-on-insulator layer cannot exceed 20 At. % (i.e., x=0.20), then the required SiGe thickness is calculated as follows: The misfit strain, fm, is calculated by the above equation to be fm(20%)=0.754%. For a fm'=0.60%, a residual strain, eres, of 0.154% is required (0.754−0.60). Using the empirical form of the residual strain to find the required SiGe layer thickness (or estimating using the curves in FIG. 2) gives a value of 840 Angstroms. Because the thermal mixing approach conserves the total Ge content between the surface oxide and buried diffusion barrier layers, any combination of thickness and Ge content whose product is (840×0.20=168) should be the SiGe layer which is grown on the provided substrate to serve as the Ge source (before thermal mixing). For instance, 1120 Angstroms of x=0.15 SiGe could be grown on the surface of a silicon-on-insulator substrate, then thermally mixed and oxidized in a manner described in the '138 application to a final SGOI thickness of 840 Angstroms and the Ge content will be x=0.20 while the in-plane lattice parameter will be 0.60% larger than Si.

The SGOI layers formed using the thermal mixing approach are found to relax in a manner that is quite consistent with the defect-strain equilibrium theory described above. In other words, as the SiGe layers are thinned by oxidation, a given Ge content and SGOI thickness will be reached and will, in general, not be in equilibrium. Dislocations are then generated until the strain energy of the film falls below the creation energy of new dislocations; bringing the film back into the condition of thermodynamic stability. The above formulas are used in determining the selected parameters, i.e., in-plane lattice parameters, thickness and Ge content, of the initial SiGe-on-insulator substrate.

The universal trend for SGOI by thermal oxidation should therefore be that the final SiGe alloy must be approaching the condition of thermodynamic stability. This would be independent of starting SiGe thickness and Ge content, or final SGOI thickness and concentration. This universality among final SGOI films is indeed observed for many different combinations of starting SiGe/SOI structures (FIG. 2). The solid line in the figure is the calculated residual SiGe strain based on equilibrium theory (discussed above) whereas the dashed line is the empirical fit to the measured data (circles).

Figure 3:
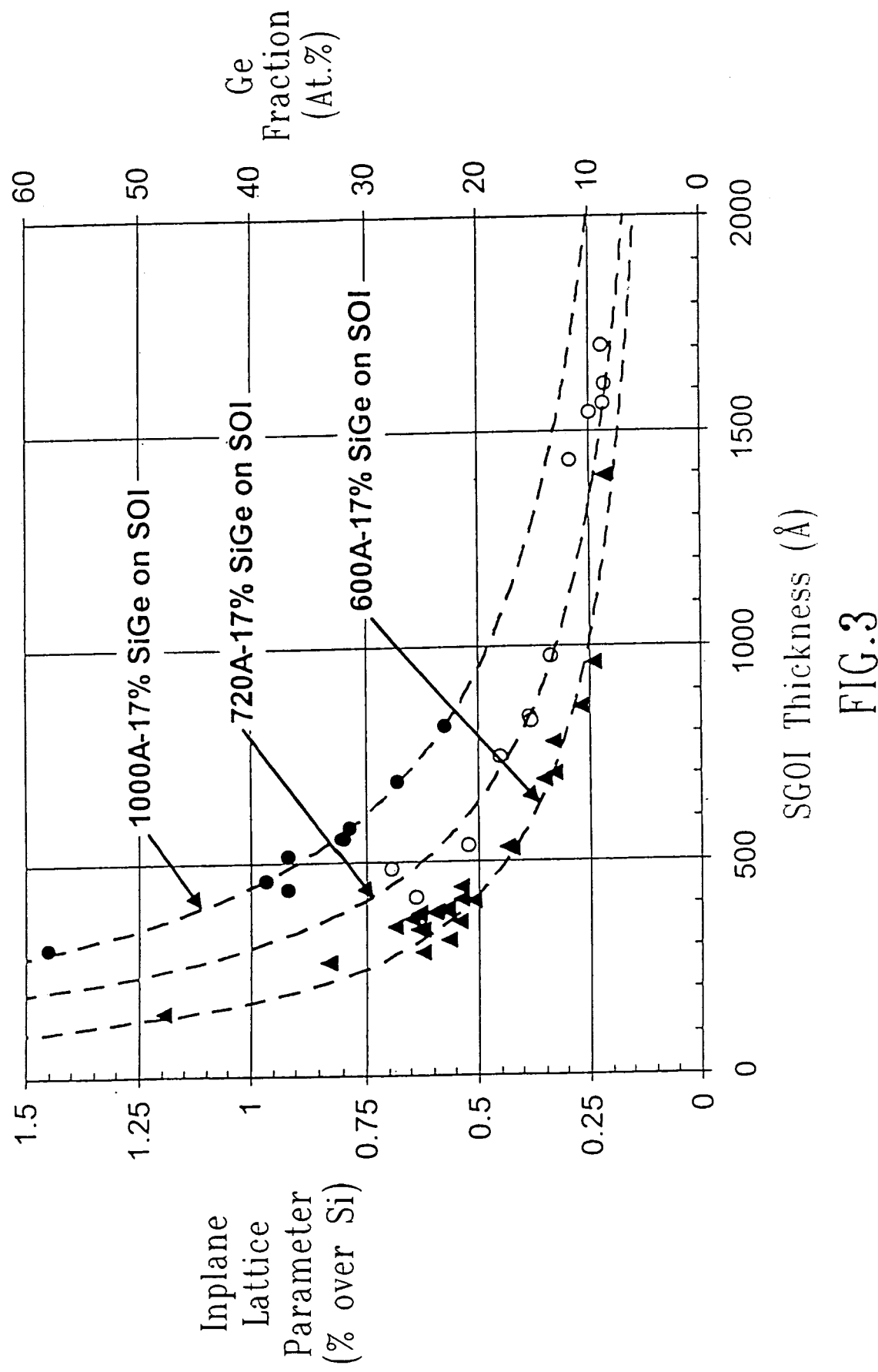
FIG. 3 is a graph of measured in-plane lattice expansion and Ge fraction vs. SiGe thickness for three different films.

As a result of the SGOI layers only being partially relaxed in the manner described above, one would need to know a priori what SGOI thickness and Ge content would yield a particular in-plane lattice parameter. FIG. 3 shows what the measured in-plane lattice parameter (compared to Si) is for three different starting structures as a function of remaining SGOI thickness.

The above is used in the present invention to provide the initial SiGe-on-insulator substrate shown in FIG. 1A. In this first embodiment, the in-plane lattice parameter and the Ge content of the SiGe alloy film are constant. The thickness of the SiGe alloy film is thicker than is desired. To thin the SiGe alloy layer having fixed and constant in-plane lattice parameter and Ge content, a non-selective etching process may be used to provide the structure shown in FIG. 1B. The final SiGe-on-insulator substrate shown in FIG. 1B has a final thickness that is less than the adjustable thickness in the initial SiGe-on-insulator substrate.

Examples of non-selective etching processes that may be used in the first embodiment of the present invention include, but are not limited to: chemical mechanical polishing (CMP), low temperature steam oxidation, chemical etching, high-pressure oxidation, epi-based HCl etching, reactive-ion etching (RIE), gas-cluster ion beam etching and any combination thereof.

Figure 1B:
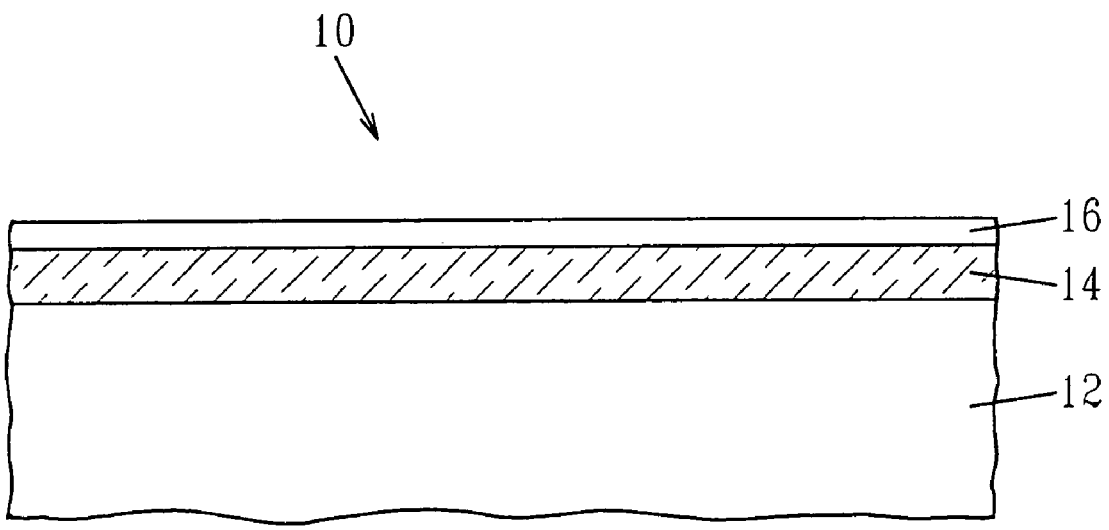

A Si layer may be formed atop the SiGe layer 16 of FIG. 1B using a conventional epitaxial deposition process well known in the art. The thickness of the epi-Si layer may vary, but typically, the epi-Si layer has a thickness of from about 1 to about 100 nm, with a thickness of from about 1 to about 30 nm being more highly preferred.

In some instances, additional SiGe can be formed atop the SiGe layer 16 of FIG. 1B utilizing an epitaxial deposition process, and thereafter an epi-Si layer may be formed atop the additional SiGe layer. In instances in which the SiGe layer 16 has a large in-plane lattice parameter as compared to the epi-Si layer, the epi-layer will be strained in a tensile manner.

As stated above, the present invention also contemplates superlattice structures as well as lattice mismatched structures which include at least the SiGe-on-insulator substrate material of the present invention. In the case of superlattice structures, such structures would include at least the substantially relaxed SiGe-on-insulator substrate material of the present invention, and alternating layers of Si and SiGe formed atop the substantially relaxed SiGe layer of the substrate material.

In the case of lattice mismatched structures, GaAs, GaP or other like compound would be formed atop the substantially relaxed SiGe layer of the inventive SiGe-on-insulator substrate material.

II. Thermal Dilution

In the second embodiment of the present invention, an initial SiGe-on-insulator substrate material is first provided having a selected in-plane lattice parameter that has a constant value to be present in the final SiGe-on-insulator substrate. The Ge content parameter and the thickness parameter of the SiGe alloy layer of the initial SiGe-on-insulator substrate are adjustable, meaning that they have values that are different from the desired Ge content or layer thickness. Thermal dilution is then used to adjust the Ge content of the SiGe layer.

Figure 4A:
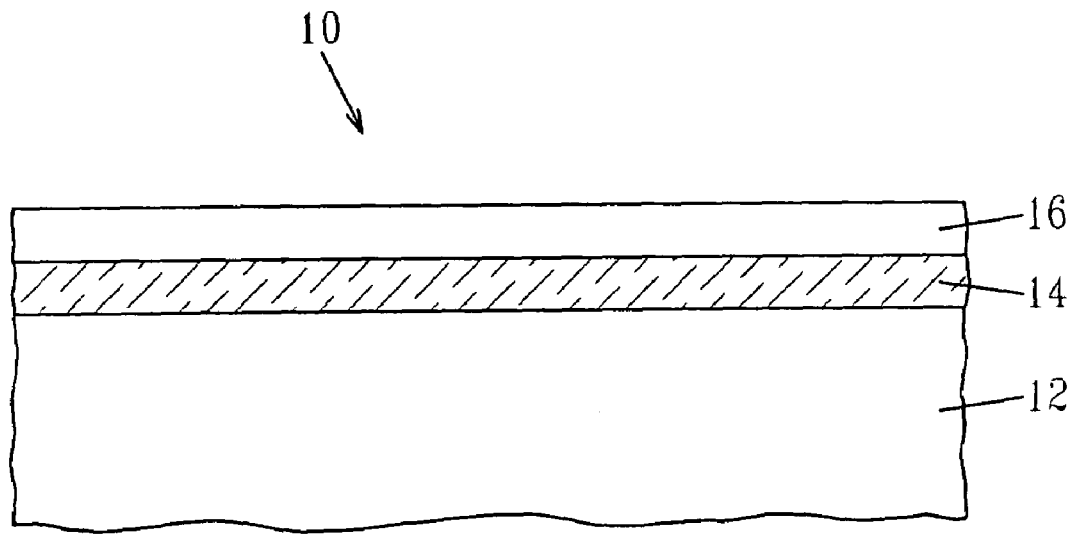
FIGS. 4A–4D are pictorial representations (through cross-sectional views) illustrating another embodiment of the present invention in which thermal dilution is employed to obtain a SiGe-on-insulator substrate having a SiGe alloy layer of a desired Ge content.

The initial structure used in this embodiment of the present invention is shown in FIG. 4A. The initial SiGe-on-insulator substrate 10 of FIG. 4A comprises a Si-containing layer 12, a barrier layer 14 that is resistant to Ge diffusion located atop the Si-containing layer 12, and a SiGe alloy layer 16 that is located atop the barrier layer 14.

In the second embodiment of the present invention, the SiGe alloy layer 16 of the initial SiGe-on-insulator substrate 10 has a constant and selected in-plane lattice parameter and an adjustable layer thickness and Ge content parameter. The initial SiGe-on-insulator substrate material 10 can be made using the various techniques that are described above, and the above formulas as well as rational may be used in determining the various parameters of the initial structure. In a preferred embodiment of the present invention, the initial SiGe-on-insulator substrate is formed using the thermal mixing process disclosed in the '138 application.

Figure 4B:
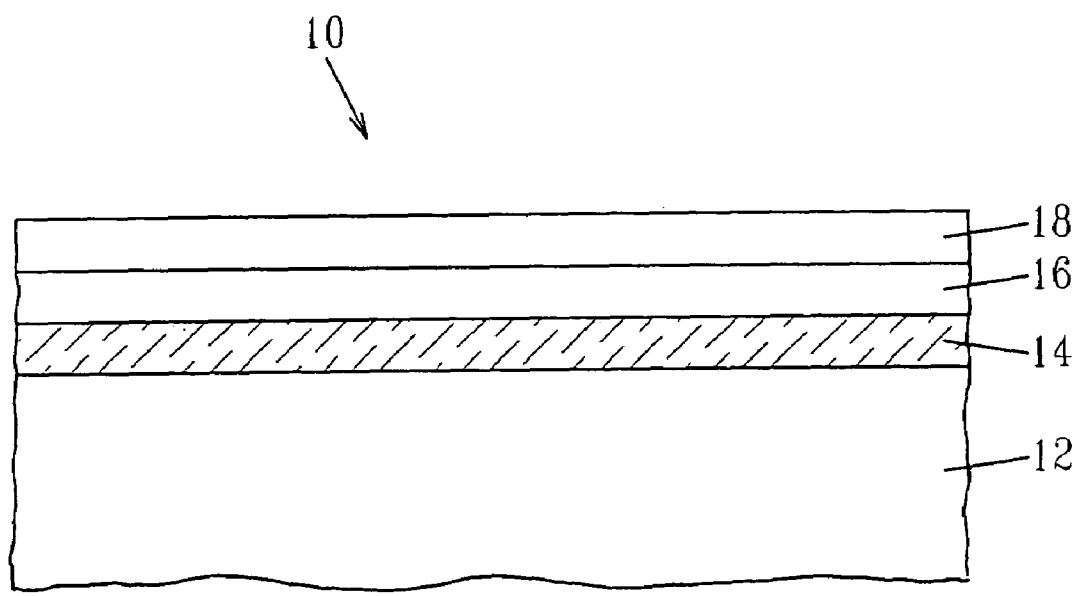

Next, and as shown in FIG. 4B, a Si-containing layer 18 having a thickness that is below the critical thickness for a given in-plane lattice parameter is formed on the surface of the SiGe alloy layer 16. Specifically, Si-containing layer 18 is formed using a conventional epitaxial deposition process well known in the art and the grown Si-containing layer 18 has a thickness of from about 1 to about 100 nm, with a thickness of from about 5 to about 50 nm being more highly preferred. The term "Si-containing" is used herein to denote Si (single crystal or polycrystalline) or SiGe. The critical thickness of the Si-containing layer 18 can be found by first calculating the misfit strain between the Si-containing layer 18 and the SiGe alloy layer 16, then using the residual strain equations (or charts) to determine what layer thickness corresponds to that strain value.

Figure 4C:
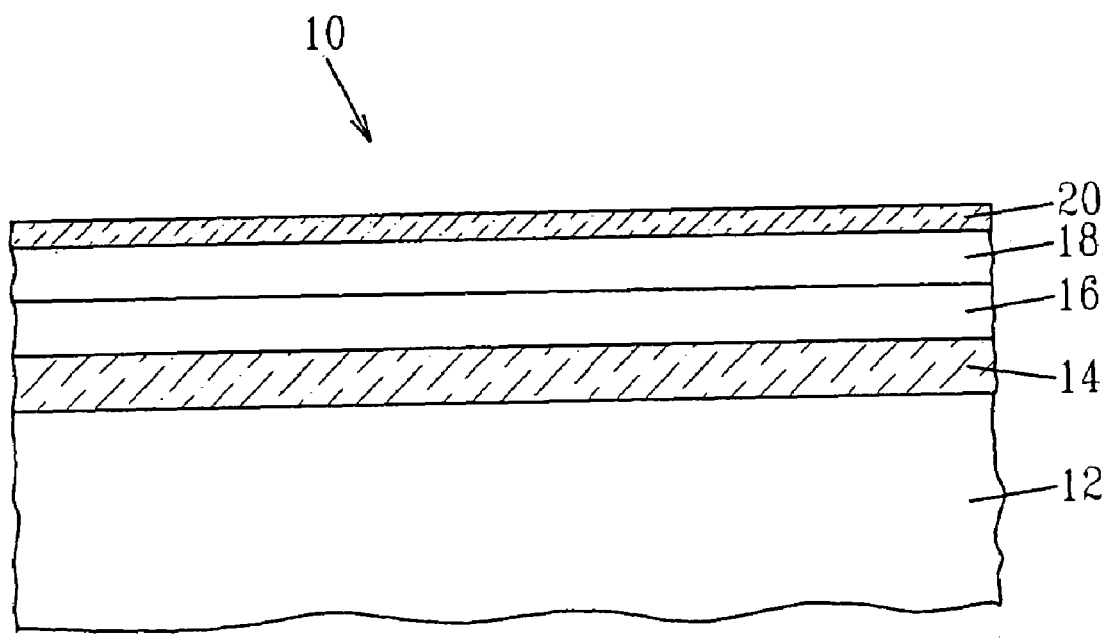

FIG. 4C shows an optional embodiment in which a capping layer 20 is formed atop the Si-containing layer 18. The capping layer 20 is a crystalline or non-crystalline oxide or nitride layer that is capable of limiting the exposure of the ambient gas to the surface of the Si-containing layer 18. The optional capping layer 20 may have any thickness, but typically optional capping layer 20 has a thickness of from about 10 to about 1000 nm, with a thickness of from about 50 to about 500 nm being more highly preferred. The optional capping layer 20 may be formed utilizing any conventional deposition process or a thermal growing process may be used to form the optional capping layer 20 atop the Si-containing layer 18.

Figure 4D:
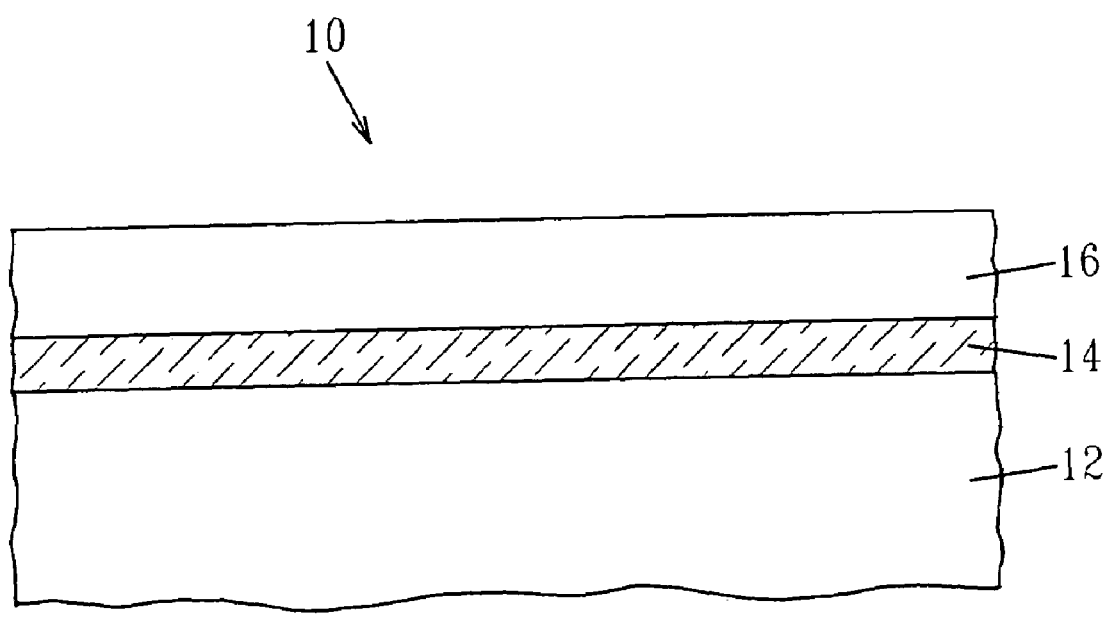

After forming the structure shown in FIG. 4B or 4C, the structure is then heated, i.e., annealed, at a temperature that permits diffusion of Si from the Si-containing layer 18 into the SiGe layer 16 so as to decrease the Ge content of the initial SiGe layer 16 into a desired Ge content. It is noted that the dilution anneal homogenizes Si throughout the SiGe layer 16 and the Si-containing layer 18. FIG. 4D shows the resultant structure after the dilution anneal step has been performed on the structure shown in FIG. 4B.

Specifically, the heating step of the present invention is an annealing step that is performed at a temperature of from about 800° to about 1350° C., with a temperature of from about 900° to about 1200° C. being more highly preferred. Moreover, the dilution step of the present invention is carried out in an inert gas such as He, Ar, N2, Xe, Kr, or Ne. Mixtures of the aforementioned inert gases are also contemplated in the present invention. In embodiments in which the optional capping layer 20 is present, the thermal dilution may be performed in the presence of a slight oxidizing ambient.

The heating step may be carried out for a variable period of time that typically ranges from about 10 to about 1800 minutes, with a time period of from about 60 to about 600 minutes being more highly preferred. The heating step may be carried out at a single targeted temperature, or various ramp and soak cycles using various ramp rates and soak times can be employed.

If the resultant SiGe layer is too thick, a non-selective etching process as described above may be used to thin the SiGe layer 16 to a final desired thickness.

A Si layer may be formed atop the SiGe layer 16 of FIG. 4D using a conventional epitaxial deposition process well known in the art. The thickness of the epi-Si layer may vary, but typically, the epi-Si layer has a thickness of from about 1 to about 100 nm, with a thickness of from about 1 to about 30 nm being more highly preferred.

In some instances, additional SiGe can be formed atop the SiGe layer 16 of FIG. 4D utilizing an epitaxial deposition process, and thereafter an epi-Si layer may be formed atop the additional SiGe layer. In instance in which the SiGe layer 16 has a large in-plane lattice parameter as compared to the epi-Si layer, the epi-layer will be strained in a tensile manner. The present invention also contemplates that the said additional SiGe formed atop the SiGe layer 16 of FIG. 4D be lattice matched (Ge content selected so that the misfit strain equals zero) so that thick SiGe layers can be made which remain thermodynamically stable.

As stated above, the present invention also contemplates superlattice structures as well as lattice mismatched structures which include at least the SiGe-on-insulator substrate material of the present invention. In the case of superlattice structures, such structures would include at least the substantially relaxed SiGe-on-insulator substrate material of the present invention, and alternating layers of Si and SiGe formed atop the substantially relaxed SiGe layer of the substrate material.

In the case of lattice mismatched structures, GaAs, GaP or other like compounds would be formed atop the substantially relaxed SiGe layer of the inventive SiGe-on-insulator substrate material.

The above description provides a basic overview of the method of the present invention, the following description provides some specific applications of the method of the present invention.

To make a SGOI layer that is 100% relaxed using the thermal oxidation method, the following approach could be used. The first thing to consider is what in-plane lattice parameter is desired. The starting SiGe/SOI structure is then oxidized at high temperature until it has reached a thickness and Ge fraction combination that corresponds to the desired in-plane lattice parameter. The previously described equations and rationale would help estimate this. FIG. 3 shows, for these starting structures, that thermal oxidation to a 20% Ge content would give approximately 0.5% in-plane expansion. For 100% relaxation (or to recover a cubic unit cell), the Ge content corresponding to this in-plane expansion should be 13.5%, so it is necessary to dilute the SiGe alloy with Si. Epitaxial growth of a (tensile strained) Si layer followed by another high temperature diffusion anneal to homogenize the Si is used to dilute the SiGe. The in-plane parameter would not change as long as all the strained layers are thermodynamically stable, so for 0.5% strain in the Si, the maximum thickness that could be used for dilution is about 250 Å. Based on this, a 520 Å-20% final SGOI layer is desired, upon which 250 Å Si will be grown. A diffusion anneal can then be used to homogenize the Si throughout the SGOI making the final film 770 Å-13.5% and because the in-plane parameter will still be 0.5%, the film will be 100% relaxed. If a thinner film is desired with these properties, then a non-selective SiGe removal process needs to be used to thin the layer to the desired thickness. Such non-selective techniques include, but are not limited to: CMP, low temperature steam oxidation, chemical etching, high-pressure oxidation, epi-based HCL etchback, RIE techniques or even gas-cluster beam thinning and smoothing. If a thicker layer with these properties is desired, then epi-based regrowth of the SiGe layer could be used.

All of this is possible because the only way a film can change its in-plane lattice parameter at the substrate scale, is by the introduction of strain relieving defects, and if the films are deliberately made stable against defect production then maintaining a fixed in-plane parameter while varying Ge content becomes possible.

It is even possible to create tensile-strained SGOI using this method. In the example given above, after formation of 100% relaxed SGOI, another iteration of Si epi growth (up to 250 Å) could be performed followed by another diffusion anneal to form even lower Ge concentration SGOI with the same 0.5% in-plane expansion. The SGOI would therefore be under tensile strain. Another way to create the tensile strained SGOI is to grow the first 250 Å epi Si on a thinner 20% SGOI (e.g. 400 Å instead of the 520 Å in the previous example) and diffuse the Si throughout the SGOI.

It is even possible to grow very thick, highly relaxed SiGe layers as starting structures on the SOI substrates and use the high temperature annealing and/or oxidation to reduce the defects within the thick layers. Non-selective thinning could then be used to thin the SGOI layer to the desired thickness.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

The invention claimed is:

1. A method of fabricating a SiGe-on-insulator substrate having selected parameters, said method comprising the steps of:
providing an initial SiGe-on-insulator substrate material comprising a SiGe alloy layer having a selected in-plane lattice parameter, a selected thickness parameter and a selected Ge content parameter, wherein the selected in-plane lattice parameter has a constant value and one or both of the other parameters has or have an adjustable value, and wherein the parameters of said initial SiGe-on-insulator substrate are selected using the following equations:

$$f'_m(\%) = f_m(\%) - |\varepsilon_{res}|$$

with $$f_m(\%) = 4.17x \text{ or}$$

$$f_m(\%) = \left( \frac{(0.19836)x + (0.03265)x^2 - (0.00436)x^3}{5.43105} \right) \times 100$$

and $$\varepsilon_{res}(\%) = \frac{b\left(1 - \frac{v}{4}\right)}{4\pi(1+v)h} \ln\left(\frac{2h}{b}\right) \times 100 \text{ or } \varepsilon_{res}(\%) = \frac{2290.4}{h^{1.4267}}$$

where $f_m'$ is the in-plane lattice parameter of a relaxed, thermodynamically stable SiGe alloy layer, given in percent larger than an unstrained Si in-plane lattice parameter, $f_m$ is the mismatch strain corresponding to an unrelaxed SiGe alloy, x is the Ge content of the SiGe alloy layer in terms of atomic fraction in the expression $Si_{1-x}Ge_x$, $\varepsilon_{res}$ is the residual strain in the SiGe alloy layer, b is the 60° dislocation Burgers vector (3.84 Å), v is the value of the Poisson ratio of the SiGe alloy layer (0.275) and h is the SiGe alloy layer thickness; and
adjusting one or both of the other parameters to a final selected value, while maintaining the selected in-plane lattice parameter, said adjusting comprises a non-selective etching process or a thermal dilution process.

2. The method of claim 1 wherein the selected in-plane lattice parameter and the selected Ge content parameter of the SiGe alloy layer are constant values and the thickness parameter is adjustable.

3. The method of claim 2 wherein said adjusting of the adjustable thickness parameter is performed using said non-selective etching process.

4. The method of claim 3 wherein said non-selective etching process is selected from the group consisting of chemical mechanical polishing (CMP), low temperature steam oxidation, chemical etching, high-pressure oxidation, epi-based HCl etching, reactive-ion etching (RIE), gas-cluster ion beam etching and any combination thereof.

5. The method of claim 1 wherein the selected in-plane lattice parameter of the SiGe alloy layer has a constant value and the Ge content parameter and thickness parameter of the SiGe alloy layer are adjustable.

6. The method of claim 5 wherein said adjusting of the adjustable Ge content parameter is performed using said thermal dilution process.

7. The method of claim 6 wherein said thermal dilution process comprises forming a Si-containing layer on the SiGe alloy layer and then heating the layers at a temperature to cause diffusion of Si into the SiGe alloy layer thereby decreasing the Ge content of the SiGe alloy layer.

8. The method of claim 7 wherein said Si-containing layer comprises Si or SiGe.

9. The method of claim 7 wherein said temperature of said heating is from about 800° to about 1350° C.

10. The method of claim 7 wherein said heating is performed in an inert gas atmosphere.

11. The method of claim 7 further comprising forming a capping layer on the Si-containing layer prior to said heating.

12. The method of claim 11 wherein the capping layer comprises a crystalline or non-crystalline oxide or nitride.

13. A method of fabricating a SiGe-on-insulator substrate having selected parameters said method comprising the steps of:
providing an initial SiGe-on-insulator substrate material comprising a SiGe alloy layer having a selected in-plane lattice parameter, a selected thickness parameter and a selected Ge content parameter, wherein said selected in-plane lattice and Ge content parameters have a constant value and the thickness parameter has an adjustable value and said parameters of said initial SiGe-on-insulator substrate are selected using the following equations:

$$f'_m(\%) = f_m(\%) - |\varepsilon_{res}| \text{ with } f_m(\%) = 4.17x \text{ or}$$

$$f_m(\%) = \left( \frac{(0.19836)x + (0.03265)x^2 - (0.00436)x^3}{5.43105} \right) \times 100 \text{ and}$$

$$\varepsilon_{res}(\%) = \frac{b\left(1 - \frac{1}{4}\right)}{4\pi(1+v)h} \ln\left(\frac{2h}{b}\right) \times 100 \text{ or } \varepsilon_{res}(\%) = \frac{2290.4}{h^{1.4267}}$$

where $f_m'$ is the in-plane lattice parameter of a relaxed, thermodynamically stable SiGe alloy layer, given in percent larger than an unstrained Si in-plane lattice parameter, $f_m$ is the mismatch strain corresponding to an unrelaxed SiGe alloy, x is the Ge content of the SiGe alloy layer in terms of atomic fraction in the expression $Si_{1-x}Ge_x$, $\varepsilon_{res}$ is the residual strain in the SiGe alloy layer, b is the 60° dislocation Burgers vector (3.84 Å), v is the value of the Poisson ratio of the SiGe ahoy layer (0.275), and h is the SiGe alloy layer thickness; and adjusting the thickness parameter using a non-selective etching process to a final selected value, while maintaining the two selected values that are constant.

14. A method of fabricating a SiGe-on-insulator substrate having selected parameters, said method comprising the steps of:

providing an initial SiGe-on-insulator substrate material comprising a SiGe alloy layer having a selected in-plane lattice parameter, a selected thickness parameter and a selected Ge content parameter, wherein said selected in-plane lattice parameter has a constant value and the Ge content and thickness parameters have adjustable values and said parameters of said initial SiGe-on-insulator substrate are selected using the following equations:

$$f'_m(\%) = f_m(\%) - |\varepsilon_{res}| \text{ with } f_m(\%) = 4.17x \text{ or}$$

$$f_m(\%) = \left( \frac{(0.19836)x + (0.03265)x^2 - (0.00436)x^3}{5.43105} \right) \times 100 \text{ and}$$

$$\varepsilon_{res}(\%) = \frac{b\left(1 - \frac{1}{4}\right)}{4\pi(1+v)h} \ln\left(\frac{2h}{b}\right) \times 100 \text{ or } \varepsilon_{res}(\%) = \frac{2290.4}{h^{1.4267}}$$

where $f_m'$ is the in-plane lattice parameter of a relaxed, thermodynamically stable SiGe alloy layer, given in percent larger than an unstrained Si in-plane lattice parameter, $f_m$ is the mismatch strain corresponding to an unrelaxed SiGe alloy, x is the Ge content of the SiGe alloy layer in terms of atomic fraction in the expression $Si_{1-x}Ge_x$, $\varepsilon_{res}$ is the residual strain in the SiGe alloy layer, b is the 60° dislocation Burgers vector (3.84 Å), v is the value of the Poisson ratio of the SiGe alloy layer (0.275), and h is the SiGe alloy layer thickness; and adjusting the Ge content to a final selected value using a thermal dilution process, while maintaining the selected in-plane lattice parameter.

15. The method of claim 14 wherein said thermal dilution process comprises forming a Si-containing layer on the SiGe alloy layer and then heating the layers at a temperature to cause diffusion of Si into the SiGe alloy thereby decreasing the Ge content of the SiGe alloy layer.

* * * * *